(12) United States Patent
Toki et al.

(10) Patent No.: US 7,496,063 B2
(45) Date of Patent: Feb. 24, 2009

(54) TIME DIVISION MULTIPLEXING RADIO SYSTEM FOR CONTROLLING TRANSMISSION POWER

(75) Inventors: Kazuya Toki, Sendai (JP); Shohei Taniguchi, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1082 days.

(21) Appl. No.: 09/879,077

(22) Filed: Jun. 13, 2001

(65) Prior Publication Data

US 2002/0021687 A1  Feb. 21, 2002

(30) Foreign Application Priority Data

Jun. 14, 2000  (JP)  ............................. 2000-178655

(51) Int. Cl.
*H04B 7/185*  (2006.01)
(52) U.S. Cl. ..................... 370/318; 370/321; 370/282; 455/78; 455/522
(58) Field of Classification Search ................. 370/317, 370/318, 278, 321, 282; 455/83, 115.3, 13.4, 455/127.1, 522, 423, 226.1, 78; 375/227, 375/346, 224; 327/227
See application file for complete search history.

(56) References Cited

U.S. PATENT DOCUMENTS

| | | | | |
|---|---|---|---|---|
| 4,810,960 A | * | 3/1989 | Owen et al. ............... | 324/76.44 |
| 5,475,709 A | * | 12/1995 | Futagami et al. ............ | 375/224 |
| 5,550,812 A | * | 8/1996 | Philips ....................... | 370/203 |
| 5,740,536 A | * | 4/1998 | Benveniste ................. | 455/447 |
| 6,101,218 A | * | 8/2000 | Nagano ...................... | 375/224 |
| 6,112,059 A | * | 8/2000 | Schwent et al. .......... | 455/67.11 |
| 6,339,711 B1 | * | 1/2002 | Otaka et al. .............. | 455/550.1 |
| 6,741,837 B1 | * | 5/2004 | Nakano et al. .............. | 375/227 |

FOREIGN PATENT DOCUMENTS

JP  0677876  3/1994

* cited by examiner

*Primary Examiner*—Ian N Moore
(74) *Attorney, Agent, or Firm*—Dickinson Wright, PLLC

(57) ABSTRACT

A time-division multiplexing radio system controls transmission power based on an adjacent-channel leakage power ratio with precision and stability. The system has a directional coupler arranged at an output stage of a power amplifier in a transmitter and that has outputs directed to an antenna and a receiver, and a reception RF switch arranged at an input stage of a frequency converter in a receiver and that has inputs directed to the antenna and the coupler. Under transmission, the switch is switched over to the coupler so that the receiver receives the present channel to detect transmission power thereof. Also the receiver is set to receive an adjacent channel under transmission, so that adjacent-channel leakage power is detected. Based on those pieces of detected information, the ratio is calculated. To make the power ratio meet a specified condition, the transmission power of the transmitter is controlled.

6 Claims, 6 Drawing Sheets

TIME DIVISION MULTIPLEXING RADIO SYSTEM FOR CONTROLLING TRANSMISSION POWER

BACKGROUND OF THE INVENTION

1. Field of the Invention

The present invention relates to a time-division multiplexing radio system, and especially to the time-division multiplexing radio system that secures the linearity of a signal output to be transmitted.

2. Description of the Related Art

In general, in digital modulation radio systems that use a time-division multiplex technique, large amounts of nonlinear distortion of a signal amplified by a power amplifier incorporated in a transmitter will increase power to be leaked into adjacent channels. The larger the leaked power, the more deteriorated the modulation precision of a transmission signal which has large influence on transmission characteristics. Conventionally, in order to prevent the transmission characteristics due to such nonlinear distortion from being deteriorated, there have been known techniques of detecting power leaked into an adjacent channel. The detected power is used to control the transmission power so that the nonlinear distortion becomes small.

A radiophone system disclosed by Japanese Patent Publication (before examination) No. 6-77876 is known as the conventional radio system making use of the time-division multiplexing technique that controls the transmission power. This radiophone system makes use of, under transmission, power slightly leaked from a transmission/reception switchover switch that switches over between a transmitter and a receiver. Based on this detected adjacent-channel leakage power, the transmission power is controlled so that the nonlinear distortion arising in a transmission power amplifier becomes small. Thus, the intention of this system is to maintain the linearity of a transmitted output. A characteristic of selectivity of channels in this radiophone system depends on attenuation at an intermediate frequency filter incorporated in the receiver.

However, such conventional radio systems that operate on the time-division multiplexing technique have a configuration of detecting the leakage power into an adjacent channel by sensing a slight amount of leaked power from the transmission/reception switchover circuit. This causes a level of the leaked power to vary depending on various factors, such as irregularities in quality of circuit parts or changes in surrounding environments, even when the transmitted power is kept to the same amount. That is, in the case of the conventional radio systems, it is almost difficult to detect the leaked power of an adjacent channel with precision.

This lack of precision in detecting the leaked power makes it impossible to control the transmission power with precision and stability, which results in a problem that the linearity of the transmitted output can not be attained satisfactorily.

As stated above, the characteristic of selectivity of channels in the conventional time-division multiplexing radio system depends on an amount of the signal attenuated by the intermediate frequency filter. Accordingly, in a system with narrow band intervals between channels, a signal to be transmitted to the present channel can not be fully prevented from being leaked, resulting in a reduced detectable dynamic range of the adjacent channel.

SUMMARY OF THE INVENTION

The present invention attempts to solve such a problem that the conventional techniques have been encountered. A first object of the present invention is to detect the transmission power of the present channel with a sufficient precision, so that information about the detected transmission power can be utilized for control of the transmission power.

A second object of the present invention is to accurately detect power that leaks into an adjacent channel, so that information about the detected leakage power can be used for control of transmission power.

A third object of the present invention is to, in a precise and stable manner, detect an adjacent-channel leakage power ratio, such that transmission power can be controlled with precision and stability, thus being able to provide a time-division multiplexing radio system with improved transmission characteristics.

A fourth object of the present invention is to make it possible that precisely detected and steady information about the above adjacent channel leakage power ratio is used for a transmission check of transmission carried out before actual transmission.

In order to realize the first object, according to one example of the present invention, there is provided a time-division multiplexing radio system equipped with a transmitter and a receiver, comprising: a directional coupler arranged at an output side of an amplifier of the transmitter and of which outputs are coupled with a side to an antenna and a side to the receiver; a reception RF switch arranged at an input side of a Frequency converter of the receiver and of which inputs are coupled with a side to the antenna and a side to the directional coupler; setting means for setting the receiver so that the receiver receives an adjacent channel under transmission; switchover means for switching over the reception RF switch to the side to the directional coupler under the transmission; and leakage power detecting means for detecting an adjacent-channel leakage power under the transmission Accordingly, the receiver for the present channel is utilized to detect adjacent-channel leakage power with higher precision and stability, without possessing a second detection circuit dedicated to the adjacent-channel leakage power.

In order to realize the second object, according to a second embodiment of the present invention, there is provided a time-division multiplexing radio system equipped with a transmitter and a receiver, comprising: a directional coupler arranged at an output side of an amplifier of the transmitter and of which outputs are coupled with a side to an antenna and a side to the receiver; a reception RF switch arranged at an input side of a frequency converter of the receiver and of which inputs are coupled with a side to the antenna and a side to the directional coupler; setting means for setting the receiver so that the receiver receives a present channel under transmission; switchover means for switching over the reception RF switch to the side to the directional coupler under the transmission; and transmission power detecting means for detecting transmission power to a present channel under the transmission. This configuration make it possible to obtain the transmission power of the present channel with higher precision.

Moreover, in order to realize the third object, according to one example of the present invention, a time-division multiplexing radio system equipped with a transmitter and a receiver is provided. The present radio system comprise a directional coupler arranged at an output side of an amplifier of the transmitter and of which outputs are coupled with a side to an antenna and a side to the receiver; a reception RF switch arranged at an input side of a frequency converter of the receiver and of which inputs are coupled with a side to the antenna and a side to the directional coupler; switchover means for switching over the reception RF switch to the side to the directional coupler under transmission; setting means for setting the receiver so that the receiver receives a signal of a present channel under the transmission; transmission power detecting means for detecting a transmission power of the present channel under the transmission; setting means for setting the receiver so that the receiver receives a signal of an adjacent channel under the transmission; leakage power detecting means for detecting an adjacent channel leakage power under the transmission, and leakage power ration calculating means for calculating an adjacent-channel leakage power ratio on the basis of the transmission power of the present channel detected by the transmission power detecting means and the adjacent-channel leakage power detected by the leakage power detecting means Preferably, the radio system comprises control means for controlling a transmission power of the transmitter by using the adjacent-channel leakage power ratio calculated by the leakage power ration calculating means. The control means includes means for making the transmitter stop transmission thereof when the adjacent-channel leakage power ratio is lowered than a specified value under during the transmission power is kept at a rated value thereof. Further, the controlling means includes means for decreasing the gain of a gain controller and/or means for controlling a bias control circuit so that the bias of the power amplifier is set to a value that reduces the transmission power, in cases the adjacent-channel leakage power ratio reduces down to a value smaller than a specified value.

Therefore, under the transmission of the present channel, signals of both the present channel and an adjacent channel are received to detect amounts of both transmission power of the present channel and adjacent-channel leakage power. The transmission power from the transmitter is controlled so that an adjacent-channel leakage power ratio derived from the detected power amounts meets a specified value, thus preventing or suppressing communication interference into adjacent channels in a steady manner and improving quality of transmission characteristics.

Further, in order to realize the fourth object, according to another example of the present invention, the transmitter has a transmission RF switch that is arranged at an antenna-side output terminal of the directional coupler and is able to switch over a path between a first output terminal to an antenna and a second output terminal other than the first terminal, a dummy load connected to the second output terminal of the transmission RF switch, and a generator generating an RF dummy signal. The radio system further comprises switchover means for switching over the transmission RF switch so that the RF dummy signal is sent to the dummy load in pre-check transmission carried out before communication is started, the pre-check transmission being treated as the transmission, determination means for determining if the adjacent-channel leakage power ratio obtained by the leakage power ratio calculating means satisfies a specified condition or not in a state switched over to the dummy load by the switch-over means; and transmission start means for starting to transmit data to be transmitted by switching over the transmission RF switch to an antenna side thereof in cases determined that the specified condition is met. Hence, before actual transmission, it can be confirmed whether or not the adjacent-channel leakage power ratio has met a specified condition, removing unwanted interference into adjacent channels.

DESCRIPTION OF THE PREFERRED EMBODIMENT

Referring to FIGS. 1 to 8, one embodiment of a time-division multiplexing radio system according to the present invention will now be explained.

Figure 1:
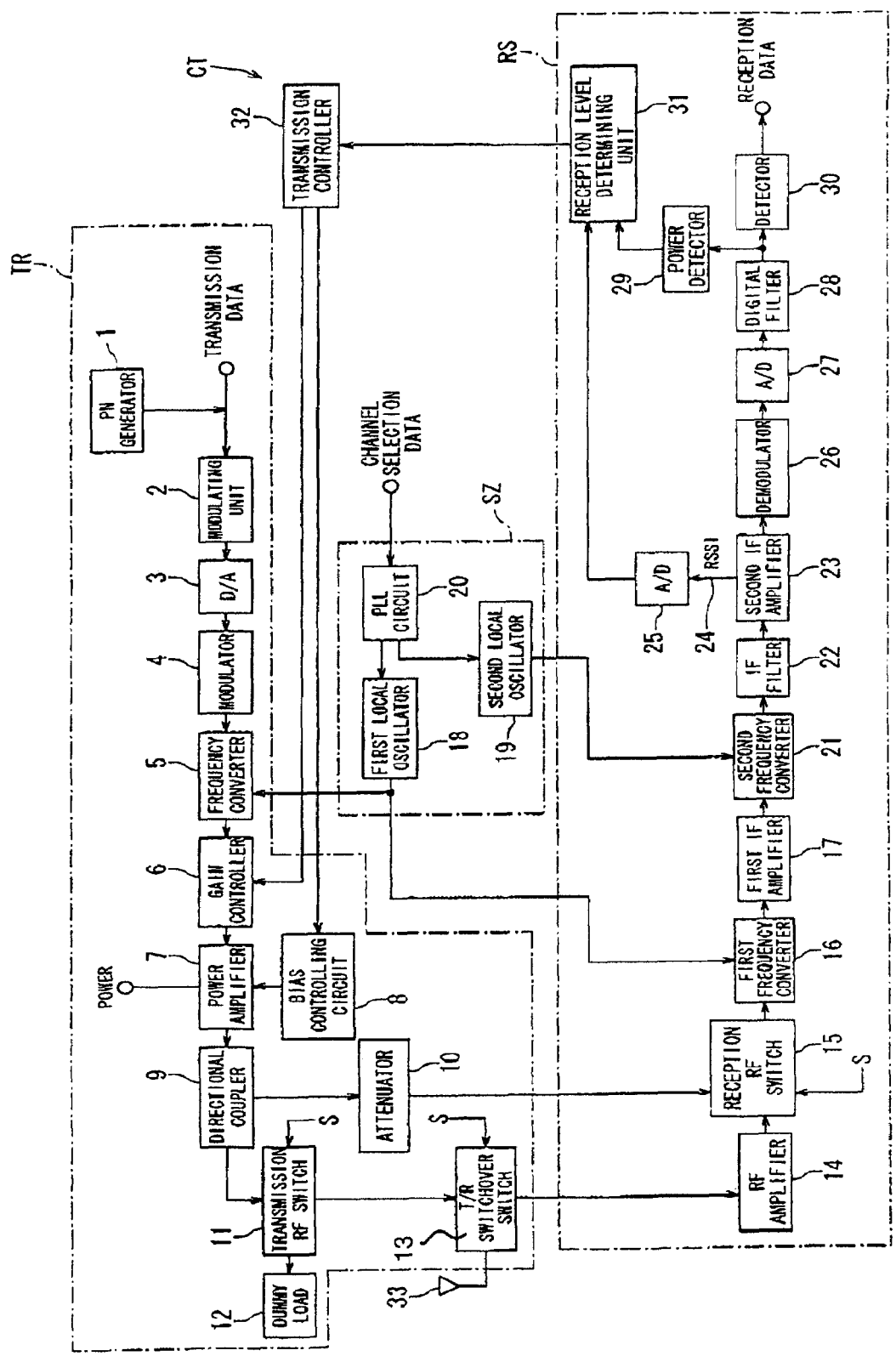
FIG. 1 is a functional block diagram showing the circuit configuration of a time-division multiplexing radio system according to one embodiment of the present invention.

FIG. 1 shows a functional block diagram of the time-division multiplexing radio system. This radio system has a function to receive power of both the present channel and an adjacent channel under transmission of the present channel so as to detect power transmitted from the present channel and power leaking into an adjacent channel. This enables detection of an adjacent-channel leakage power ratio and control of a gain of a power amplifier incorporated in a transmitter, so that the power ratio meets a specified value.

The time-division multiplexing radio system shown in FIG. 1 is equipped with a transmitter TR, receiver RS, synthesizer system SZ, and control system CT.

The transmitter TR comprises, along a path of data to be transmitted, a PN generator 1, modulator 2, D/A converter 3, modulator 4, frequency converter 5, gain controller 6, power amplifier 7, bias control circuit 8, directional coupler 9, attenuator 10, RF switch 11, dummy load 12, and the transmission/reception switchover switch 13.

Of these components, the PN (Pseudo Noise) generator 1 is uses as a circuit that generates pseudo data. The modulator 2 conducts mapping of data to be transmitted, modulation of the data by using a technique such as QPSK (Quadrature Phase Shift Keying), and process including Nyquist band limitations of the modulated output signal. The D/A converter 3 converts a modulated digital signal outputted by the modulator 2 into amplitude signals of I(In-phase channel) and Q (Quadrature channel) components.

The modulator 4 carries out quadrature modulation by using the amplitude signals of I and Q components outputted by the D/A converter 3. An amplitude signal subject to the quadrature modulation is sent to the frequency converter 5, in which the IF frequency is converted into a transmission frequency. The gain controller 6 adjusts the gain of a signal of the transmission signal outputted by the frequency converter 5 to control the amplitude of the signal level to a proper level.

The signal to be transmitted, of which amplitude is the proper level, is sent to the power amplifier 7 for power amplification. The bias of this power amplifier 7 can be controlled by the bias control circuit 8. A bias control signal is sent to the bias control circuit 8 from the transmission controller 32 described later. The bias control circuit 8 therefore controls the bias of the power amplifier 7 according to the bias control signal, attaining gain adjustment for the power amplification.

An output signal of the power amplifier 7 is sent to the directional coupler 9. The directional coupler 9 has the function of selectively coupling the output signal of the power amplifier 7 to either the side of the receiver RS and the transmission RF switch 11. The attenuator 10 is a circuit to decrease the level of a signal sent from the directional coupler 9 to a proper amount, the level-adjusted signal being given to a first frequency converter 16 through a reception RF switch 15, both of which incorporated in the receiver RS described later.

The transmission RF switch 11 functions to selectively switch over its switch paths, in response to a switch control signal S, in such a way that a signal sent from the directional coupler 9 is sent to either an antenna 33 or the dummy load 12.

When the transmission RF switch 11 is switched over to the dummy load 12, the signal to be transmitted is sent to the dummy load 12, so that the signal is terminated by this load circuit. In contrast, when the transmission RF switch 11 is switched over to the antenna 33, the signal to be transmitted is sent to the transmission/reception switchover switch 13.

The transmission/reception switchover switch 13 selectively switches over its switch path coming from the antenna 33 to either the transmitter TR or the receiver RS in response to the switch control signal S. Thus, in cases where the transmission/reception switchover switch 13 is switched over to the transmitter side, the signal is therefore transmitted through the antenna 33. However, an RF signal received by the antenna 33 is sent to the receiver RS, in the case that the transmission/reception switchover switch 13 is switched over to the receiver side.

The receiver RS is configured into a double heterodyne type of system and provided with, along a signal path from the antenna, an RF amplifier 14, reception RF switch 15, first frequency converter 16, first IF amplifier 17, second frequency converter 21, IF filter 22, second IF amplifier 23 outputting an RSSI (Received Signal Strength Indicator) signal 24, A/D converter 25, demodulator 26, A/D converter 27, digital filter 28, power detector 29, detector 30, and reception level determining unit 31.

The RF amplifier 14 amplifies the signal coming from the antenna 33, which has been received through the transmission/reception switchover switch 13, up to a signal of a proper level, and sends it to one input terminal of the reception RF switch 15.

As stated above, the other input terminal of the reception RF switch 15 electrically couples to the directional coupler 9 of the transmitter TR through the attenuator 10. In response to the switch control signal S, the reception RF switch 15 thus switches over its switch path selectively to either the receiver RS or the transmitter TR.

An output terminal of the reception RF switch 15 is connected to the first frequency converter 16. Accordingly, the signal to be transmitted from the transmitter TR or the signal received by the antenna 33, which is switched over depending on the switch control signal S, is sent to the first frequency converter 16 through the reception RF switch 15.

The first frequency converter 16 serves as a circuit which converts the inputted RF signal into a signal of a first IF (intermediate frequency) by using a signal of a locally oscillated frequency which will be described later. The converted IF signal is then sent to the first IF amplifier 17, in which the signal is amplified up to a proper signal level. The amplified IF signal is then sent to the second frequency converter 21.

The second frequency converter 21 uses a later-described signal of a locally oscillated frequency to convert the amplified first IF signal into a signal of a second IF signal. The second IF signal is further sent to the IF filter 22, in which the IF frequency is subjected to appropriate band limitations.

The band-limited second IF signal is then sent to the second IF amplifier 23. While carrying out power amplification of the inputted second IF signal up to a proper amplitude level, the second IF amplifier 23 outputs the RSSI signal 24 in voltage amounts according to a reception level of the second IF signal. This RSSI signal is sampled, and then converted into a digital signal by the AD converter 25. The RSSI signal with digital quantities is sent to the reception level determining unit 31.

The second IF signal amplified by the second IF amplifier 23 is sent to the demodulator 26, in which the signal is demodulated by quadrature demodulation. Demodulated baseband I and Q signals are converted into digital-amount reception signals by the A/D converter 27.

The digital-amount reception signals are further subject to band limitations, then sent to both of the power detector 29 and the detector 30. The power detector 29 detects a reception level based on amplitudes of the digital-filtered Q and I signals. Specifically, the power detector 29 detects power by computing a formula of $(I^2+Q^2)^{1/2}$ using amplitudes of the I and Q signals. A signal thus detected is sent to the reception level determining unit 31, in which a reception level of such detected signal is determined. The detector 30 detects the digital-filtered I and Q signals, then outputs those detected signals as digital-quantity reception data.

Furthermore, the synthesizer system SZ will now be explained. The synthesizer system SZ is provided with a first local oscillator 18, second local oscillator 19, and PLL (Phased Locked-Loop) circuit 20.

Of these components, the first local oscillator 18 outputs a signal of a locally oscillated frequency required for the frequency conversions in both of the frequency converter 5 of the transmitter TR and the first frequency converter 16 of the receiver RS. The second local oscillator 19 outputs a signal of a locally oscillated frequency required for the frequency conversion in the second frequency converter 21 of the receiver RS. The PLL circuit 20 controls the frequencies oscillated in these local oscillators 18 and 19 responsively to channel selection data that have been received, thus a function of selecting channels being provided.

Furthermore, a transmission controller 32 is provided as the foregoing control system CT. This transmission controller 32 is for example configured into a computer system that includes a CPU, memories, interface and others. Thus, the transmission controller is able to automatically execute processing based on a software program for transmission power control, the program being stored in a given memory. Practically, a signal outputted from the reception level determining unit 31 is used to control the gain of the gain controller 6 and/or the bias amounts given to the bias control circuit 8 in the of the transmitter TR. Moreover, though not shown, the control system CT includes timing control means for controlling timing for switching each of the transmission RF switch 11 and transmission/reception switchover switch 13 incorporated in the transmitter TR, and the reception RF switch 15 incorporated in the receiver RS.

The operation of the time-division multiplexing radio system according to the present invention will now be described, mainly from a viewpoint of controlling transmission power.

Figure 2:
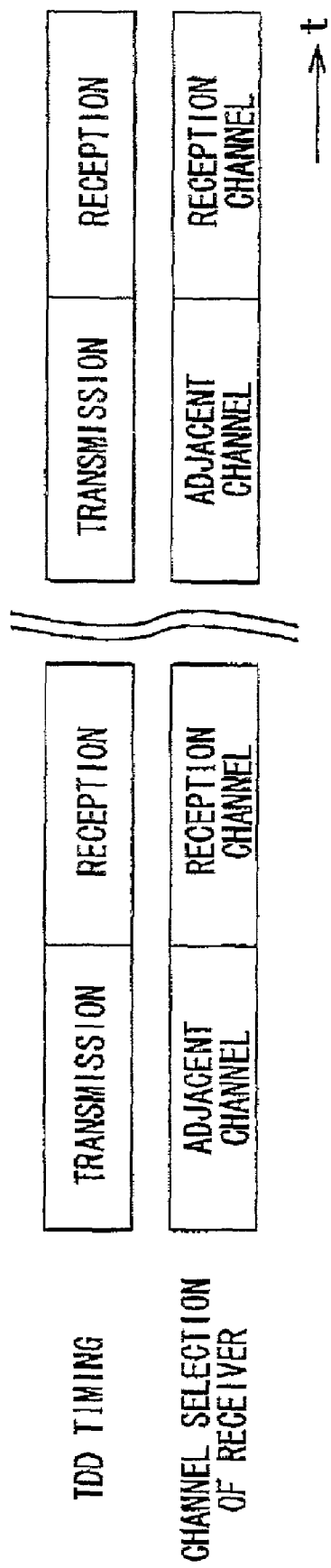
FIG. 2 shows timing of detection of adjacent-channel leakage power, the detection being performed in the time-division multiplexing radio system.
Figure 3:
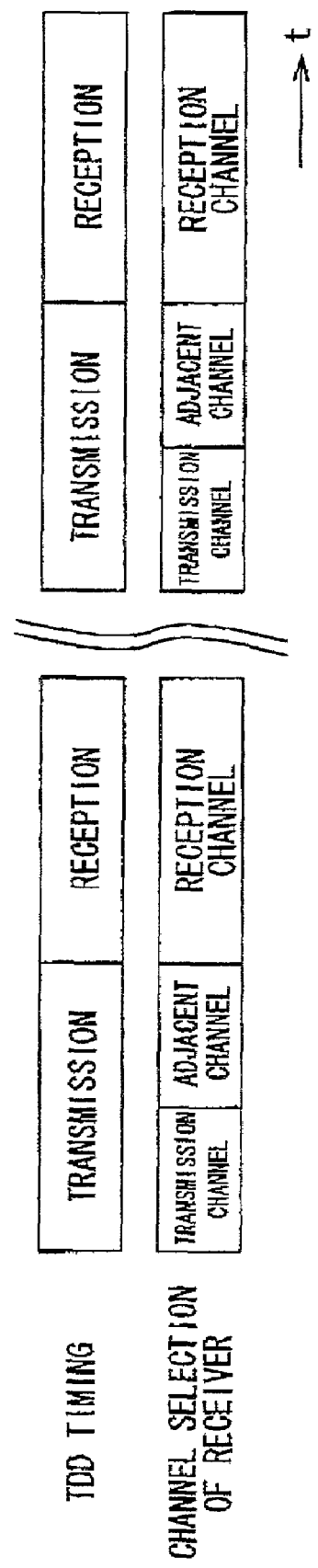
FIG. 3 shows timing of detection of an adjacent-channel leakage power ratio, the detection being performed in the time-division multiplexing radio system.
Figure 4:
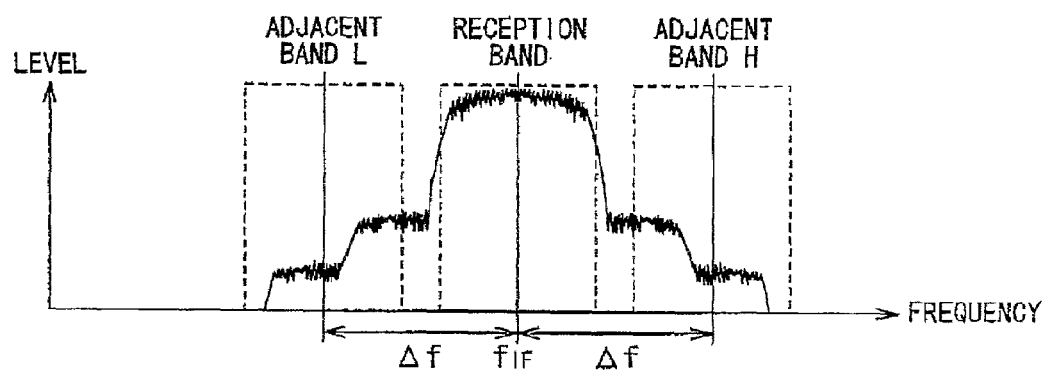
FIG. 4 is a diagram exemplifying a frequency characteristic of the power transmitted from a present channel in the IF band of a receiver mounted in the time-division multiplexing radio system.
Figure 5:
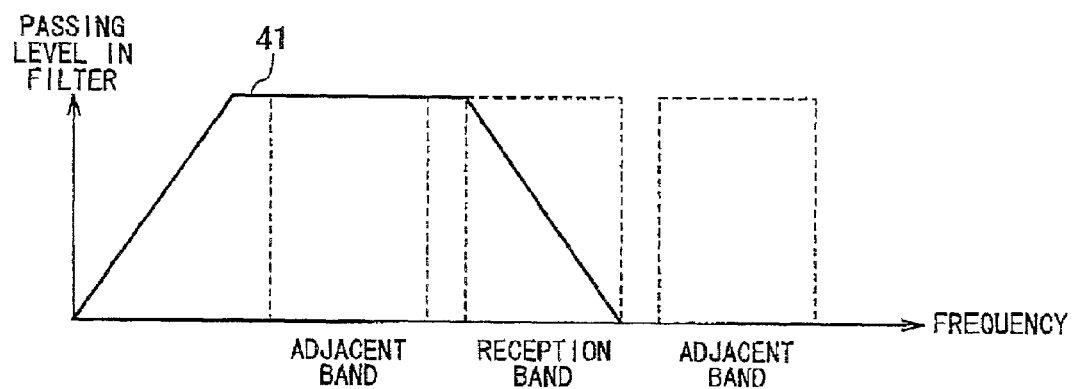
FIG. 5 exemplifies limitations on a frequency band to transmission power of a present channel, the limitations resulting from an IF filter used in the time-division multiplexing radio system.
Figure 6:
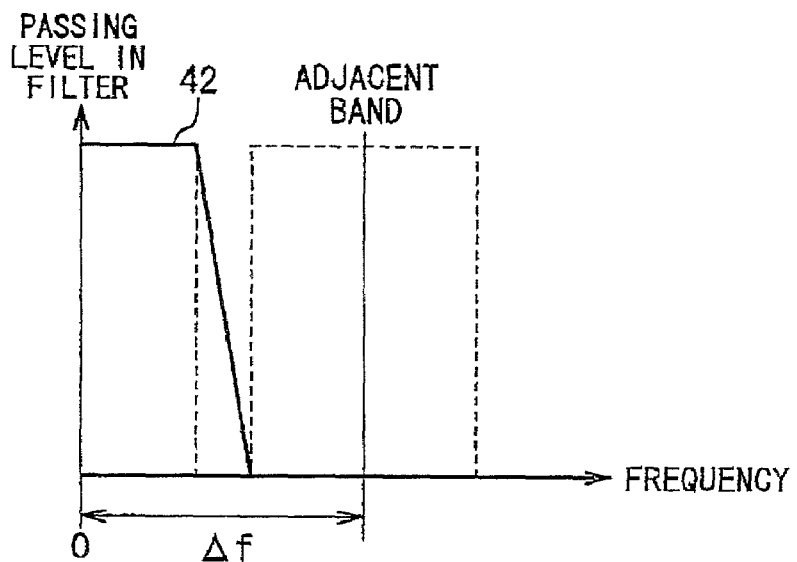
FIG. 6 exemplifies limitations on a frequency band, the limitation resulting from a digital filter used in the time-division multiplexing radio system.

FIG. 2 shows timing for detecting adjacent-channel leakage power. FIG. 3 shows timing for detecting an adjacent-channel leakage power ratio. FIG. 4 exemplifies a frequency characteristic (in the IF band) of power transmitted through the present channel in the receiver. Further, FIG. 5 exemplifies a band limitation on power transmitted through the present channel, the limitation being performed by the IF filter. FIG. 6 exemplifies a band limitation performed by the digital filter.

At first, an operation in detecting adjacent-channel leakage power will now be described.

Under transmission of which transmission power is a certain rated value, signals of adjacent channels are received according to a timing schedule shown in FIG. 2. Specifically, channel selection data are provided to the PLL circuit 20 in such a manner that the frequency from the second local oscillator 10 shown in FIG. 1 becomes an amount to receive an adjacent channel. Concurrently, the transmission/reception switchover switch 13 is switched over to the transmitter, and the reception RF switch 15 is switched over to the directional coupler 9.

In this transmission, the power of a transmitted signal in the present channel is limited in band by the IF filter 22 shown in FIG. 1. In other words, as shown in FIG. 4, signal components that give rise to power in adjacent bands (transmitted power from the present channel) $\Delta f$ apart from the intermediate frequency $f_{if}$ (center frequency) of the present channel are limited in their passage by the IF filter 22. Because the signal components that pass the IF filter 22 result in adjacent-channel leakage power, the measurement of voltage of the RSSI signal 24 permits the adjacent-channel leakage power to be detected.

The reason that the reception RF switch 15 is placed at the input side of the first frequency converter 16 is to avoid reception sensitivity from being lowered. Since a coupled output at the directional coupler 9 is by far greater in level than a signal ordinarily received in communication, it is not necessary to amplify the coupled output signal by means of the RF amplifier 14. In contrast, if the reception RF switch 15 is arranged at the inside of the RF amplifier 14, a noise figure due to passage loss at the switch 15 would be lowered under the reception of signals to be communicated, thus the reception sensitivity being deteriorated. However, such configuration is not adopted in the present embodiment, with the result that the system according to the present embodiment has nothing to do with such deterioration in the noise figure.

The capability of detecting the adjacent-channel leakage power depends on a channel selectivity resulting from a frequency characteristic 41 of the IF filter 22. In cases intervals between channels are narrow in the frequency axis, as shown in FIG. 5, or detected adjacent-channel leakage power is low in level, it is difficult to obtain a performance capable of detecting a necessary amount of the adjacent-channel leakage power. In such a case, the adjacent-channel leakage power can be detected without fail by adopting the configuration where the power is detected at the output side of the digital filter 28, as explained above.

The digital filter 28 is composed of an FIR filter or others, so that its frequency characteristic can be controlled arbitrarily by selecting the number of taps. Because this is able to provide the frequency characteristic shown in FIG. 6, with no dependency on a channel selectivity due to the frequency characteristic of the IF filter 22 composed of analog elements, the adjacent-channel leakage power can be detected. In other words, adopting the digital filter improves the channel selectivity. As a result, a cut-off characteristic for a signal to be transmitted through the present channel can be improved and a dynamic range for detectable adjacent-channel leakage power can be widened.

In the present embodiment, the adjacent-channel leakage power has been detected by using the directional coupler, which is based on a different way from conventional, that is, based on utilization of slight leakage of power from the transmission/reception switchover circuit. The directional coupler is used to route a signal to be transmitted from the transmitter to the receiver, so that the adjacent-channel leakage power can be detected with remarkable precision than conventional.

Second, an operation for detecting transmission power of the present channel.

Under transmission of the present channel of which transmission power is set to a certain rated value, signals in the present channel are received at the timing schedule shown in FIG. 3. To receive such signals, channel selection data for reception for the present channel are given to the PLL circuit 20 so that the frequency presented by the second local oscillator 19 shown in FIG. 1 is set to a frequency for receiving signals in the present channel. Concurrently, the inner signal path of the transmission/reception switchover switch 13 is switched over to its transmission side. In addition, the reception RF switch 15 is switched over to the directional coupler 9 to allow the power detector 29 to detect the transmission power of the present channel. The detected transmission power of the present channel is stored in the reception level determining unit 31.

In such a way, the signal indicative of the transmission power is introduced thorough the directional coupler allows the transmission power of the present channel to be detected in a remarkably precise and stable fashion, compared to conventional.

Third, an operation for detecting an adjacent-channel leakage power ratio will now be described.

As shown in FIG. 3, an adjacent channel is received within the same transmission slot. Specifically, channel selection data for reception for an adjacent channel are provided to the PLL circuit 20 so that the frequency from the second local oscillator 19 is set to an amount for receiving the adjacent channel. This setting makes it possible to detect adjacent-channel leakage power on the basis of the RSSI signal 24. In the reception level determining unit 31, the transmission power of the present channel that has already been detected is stored therein. Hence, the unit 31 calculates a difference between the adjacent-channel leakage power and the transmission power of the present channel, then the adjacent-channel leakage power ratio based on the difference.

Thus, the adjacent-channel leakage power ratio can be obtained with precision and stability, because the necessary information for the calculation of the ratio is collected using the directional coupler. It is therefor possible that a specified adjacent-channel leakage power ratio and the adjacent-channel leakage power ratio of an actually used system are compared with each other with precision.

Fourth, a method of controlling the transmission power in compliance with the adjacent-channel leakage power ratio that has been calculated as stated above.

Figure 7:
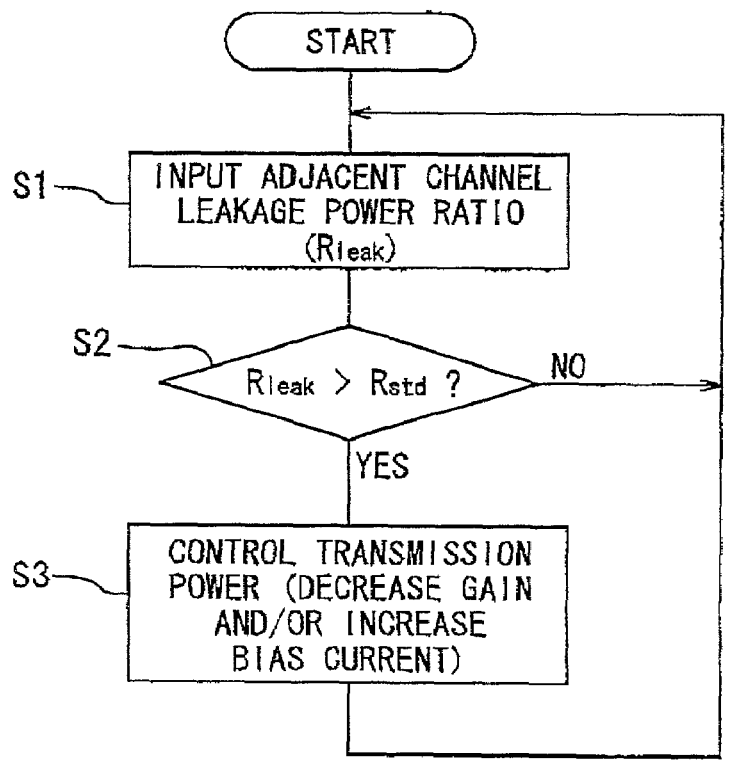
FIG. 7 is a flowchart outlining control of transmission power, which is executed in the time-division multiplexing radio system.
Figure 8:
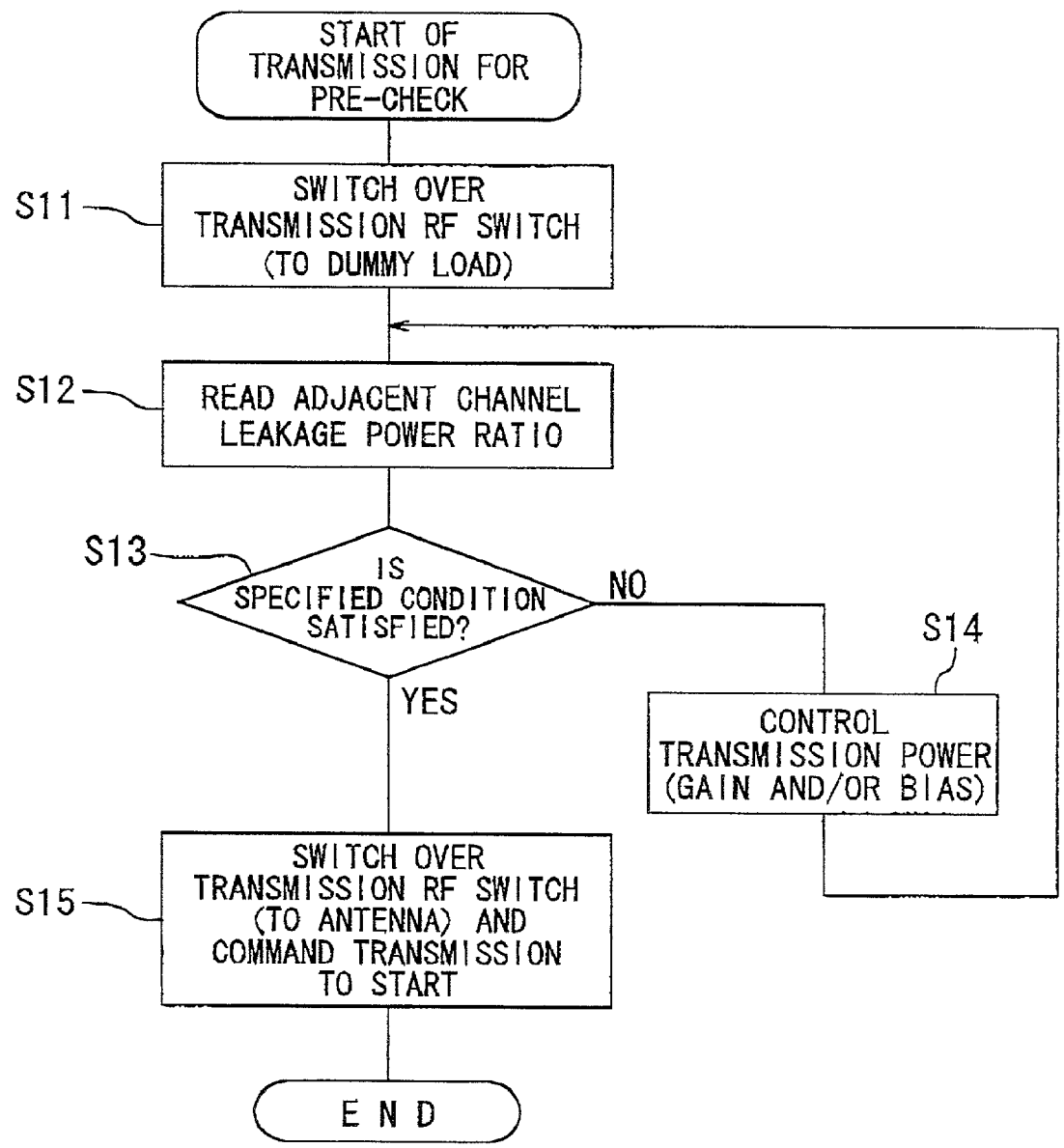
FIG. 8 is a flowchart outlining transmission power control done in pre-check transmission carried out before actual transmission, which is executed in the time-division multiplexing radio system.

On the basis of a flowchart outlined by FIG. 7, this control is carried out by the transmission controller 32 that monitors, in real time, results calculated by the reception level determining unit 31.

Specifically, the transmission controller 32 reads the adjacent-channel leakage power ratio $R_{leak}$, or a calculated result in the reception level determining unit 31 (step S1), then determines if a condition of $R_{leak}>R_{std}$ is satisfied or not, where $R_{std}$ is a specified power ratio previously determined (step S2) When the determination is affirmative (YES), that is, the adjacent-channel leakage power ratio $R_{leak}$ is larger than the specified power ratio $R_{std}$, the transmission controller 32 starts the control of the transmission power (step S3).

This control is carried out as follows. The transmission controller adjusts the gain of the gain controller 6 to reduce the transmission power and/or adjusts the bias of the power amplifier 7 through the bias control circuit 8 so as to increase current therein until the adjacent-channel leakage power ratio $R_{leak}$ reaches the specified power ratio $R_{std}$. As one control technique for this transmission power, the transmission itself may be stopped until the adjacent-channel leakage power ratio $R_{leak}$ is improved to the specified power ratio $R_{std}$.

The transmission controller 32 repeats the foregoing processing at intervals until the determination at step S2 becomes negative (NO: $R_{leak}<R_{std}$ or $R_{leak}=R_{std}$).

As described above, the transmission power is controlled based on information about the adjacent-channel leakage power detected with precision and stability. Accordingly, setting the specified power ratio $R_{std}$, i.e., a threshold, to an appropriate amount enables the transmission power of the present channel to be controlled with reliability so that the adjacent-channel leakage power ratio meets its specified value, which therefore prevents or suppresses commination interference into adjacent channels.

As a variation, upper and lower limits may be given to the specified power ratio such that the transmission power is controlled to bring the adjacent-channel leakage power ratio into a range defined by the upper and lower limits. The transmission power is thus controlled to always keep the adjacent-channel leakage power ratio at a constant, on condition that the transmission power is maintained below its rated output.

Therefore, high-quality transmission characteristics in which non-linear distortion is suppressed can be secured through the improvement in detection of the adjacent-channel leakage power ratio.

Fifth, an operation for pre-check transmission performed before transmitting actual data will now be described, in which both dummy data and the dummy load are used for the pre-check transmission. This pre-check transmission is also controlled by the transmission controller 32 on the basis a flowchart outlined in FIG. 8, in association with not-shown switchover control means.

To perform the pre-check transmission, the transmission controller 32 makes the transmission RF switch 11 to be switched over to the dummy load 12 by using the not-shown switchover control means (step S11) In this switched-over state, dummy data composed of RF signals are outputted from the PN generator 1. Responsively to this output, the transmission controller 32 reads in the adjacent-channel leakage power ratio from the reception level determining unit 31 (step S12). Such power ratio has already been calculated as stated above. Then, the transmission controller 32 determines if the adjacent-channel leakage power ratio meets a specified condition or not (step S13). If it is determined at this step that the adjacent-channel leakage power ratio does not meet the specified condition, the transmission controller 32 adjusts the gain of the gain controller 6 to lower the transmission power and/or commands the bias control circuit 8 to change the gain of the power amplifier 7 (step S14) This control is repeated until the adjacent-channel leakage power ratio satisfies the specified condition (steps S12 to S14).

By contrast, on determining a situation in which the adjacent-channel leakage power ratio satisfies the specified condition, the transmission controller 32 makes the transmission RF switch 11 to be switched over to the transmission/reception switchover switch by using the not-shown switchover control means (step S15) This switchover electrically connects the transmitter TR to the antenna 22, so that desired data to be transmitted are outputted via the antenna 33.

This power control is able to remove unwanted interference into adjacent channels, because communication is started after the adjacent-channel leakage power ratio has been set to a specified value.

As stated so far, in the time-division multiplexing radio system, under the transmission of the present channel, signals of both the present channel and an adjacent channel are received to detect amounts of both transmission power of the present channel and adjacent-channel leakage power. The transmission power from the transmitter is controlled so that an adjacent-channel leakage power ratio derived from the detected power amounts meets a specified value. Therefore, the adjacent-channel leakage power ratio can be measured precisely, thus preventing or suppressing communication interference into adjacent channels in a steady manner.

The present invention is not limited to the above-mentioned embodiment and its modifications, but a variety of further modifications are applicable to the present invention without departing from the gist thereof described in the appended claims.

What is claimed is:

1. A time-division multiplexing radio system equipped with a transmitter and a receiver, comprising:
    a directional coupler arranged at an output side of an amplifier of the transmitter and the directional coupler outputs are coupled with a side to an antenna and a side to the receiver;
    a reception RF switch arranged at an input side of a frequency converter of the receiver and the reception RF switch are coupled with a side to the antenna and a side to the directional coupler;
    switchover means for switching over the reception RF switch to the side to the directional coupler under transmission;
    setting means for setting the receiver so that the receiver receives a signal of a present channel under the transmission;
    transmission power detecting means for detecting a transmission power of the present channel under the transmission;
    setting means for setting the receiver so that the receiver receives a signal of an adjacent channel under the transmission;
    leakage power detecting means for detecting an adjacent channel leakage power under the transmission; and
    leakage power ratio calculating means for calculating an adjacent-channel leakage power ratio on the basis of the transmission power of the present channel detected by the transmission power detecting means and the adjacent-channel leakage power detected by the leakage power detecting means, wherein:

the control means includes means for making the transmitter stop transmission thereof when the adjacent-channel leakage power ratio is lowered than a specified value under the transmission power is kept at a rated value thereof.

2. A time-division multiplexing radio system equipped with a transmitter and a receiver, comprising:
a directional coupler arranged at an output side of an amplifier of the transmitter and the directional coupler outputs are coupled with a side to an antenna and a side to the receiver;
a reception RF switch arranged at an input side of a frequency converter of the receiver and the reception RF switch are coupled with a side to the antenna and a side to the directional coupler;
switchover means for switching over the reception RF switch to the side to the directional coupler under transmission;
setting means for setting the receiver so that the receiver receives a signal of a present channel under the transmission;
transmission power detecting means for detecting a transmission power of the present channel under the transmission;
setting means for setting the receiver so that the receiver receives a signal of an adjacent channel under the transmission;
leakage power detecting means for detecting an adjacent channel leakage power under the transmission; and
leakage power ratio calculating means for calculating an adjacent-channel leakage power ratio on the basis of the transmission power of the present channel detected by the transmission power detecting means and the adjacent-channel leakage power detected by the leakage power detecting means, wherein:
the transmitter has a gain controller controlling a gain of a transmitted signal, and the controlling means includes means for decreasing the gain of the gain controllers in cases the adjacent-channel leakage power ratio reduces down to a value smaller than a specified value under transmission power is at a rated value thereof.

3. A time-division multiplexing radio system equipped with a transmitter and a receiver, comprising:
a directional coupler arranged at an output side of an amplifier of the transmitter and the directional coupler outputs are coupled with a side to an antenna and a side to the receiver;
a reception RF switch arranged at an input side of a frequency converter of the receiver and the reception RF switch are coupled with a side to the antenna and a side to the directional coupler;
switchover means for switching over the reception RF switch to the side to the directional coupler under transmission;
setting means for setting the receiver so that the receiver receives a signal of a present channel under the transmission;
transmission power detecting means for detecting a transmission power of the present channel under the transmission;
setting means for setting the receiver so that the receiver receives a signal of an adjacent channel under the transmission;
leakage power detecting means for detecting an adjacent channel leakage power under the transmission; and
leakage power ratio calculating means for calculating an adjacent-channel leakage power ratio on the basis of the transmission power of the present channel detected by the transmission power detecting means and the adjacent-channel leakage power detected by the leakage power detecting means, wherein:
transmitter has a power amplifier amplifying power of a transmitted signal and a bias control circuit controlling a bias of the power amplifier, and
the controlling means includes means for controlling the bias control circuit so that the bias of the power amplifier is set to a value that reduces the transmission power, in cases the adjacent-channel leakage power ratio reduces down to a value smaller than a specified value under transmission power is at a rated value thereof.

4. A time-division multiplexing radio system equipped with a transmitter and a receiver, comprising:
a directional coupler arranged at an output side of an amplifier of the transmitter and the directional coupler outputs are coupled with a side to an antenna and a side to the receiver;
a reception RF switch arranged at an input side of a frequency converter of the receiver and the reception RF switch are coupled with a side to the antenna and a side to the directional coupler;
switchover means for switching over the reception RF switch to the side to the directional coupler under transmission;
setting means for setting the receiver so that the receiver receives a signal of a present channel under the transmission;
transmission power detecting means for detecting a transmission power of the present channel under the transmission;
setting means for setting the receiver so that the receiver receives a signal of an adjacent channel under the transmission;
leakage power detecting means for detecting an adjacent channel leakage power under the transmission; and
leakage power ratio calculating means for calculating an adjacent-channel leakage power ratio on the basis of the transmission power of the present channel detected by the transmission power detecting means and the adjacent-channel leakage power detected by the leakage power detecting means, wherein:
the transmitter has a gain controller controlling a gain of a transmitted signal, a power amplifier amplifying power of the transmitted signal, and a bias control circuit controlling a bias of the power amplifier, and
the controlling means includes means for controlling an operation of at least one of the gain controller and the bias control circuit so that the adjacent-channel leakage power ratio satisfies a specified condition thereof, when transmission power remains in a range of values of not more than a rating of transmission power.

5. A time-division multiplexing radio system equipped with a transmitter and a receiver, comprising:
a directional coupler arranged at an output side of an amplifier of the transmitter and the directional coupler outputs are coupled with a side to an antenna and a side to the receiver;
a reception RF switch arranged at an input side of a frequency converter of the receiver and the reception RF switch are coupled with a side to the antenna and a side to the directional coupler;
switchover means for switching over the reception RF switch to the side to the directional coupler under transmission;

setting means for setting the receiver so that the receiver receives a signal of a present channel under the transmission;

transmission power detecting means for detecting a transmission power of the present channel under the transmission;

setting means for setting the receiver so that the receiver receives a signal of an adjacent channel under the transmission;

leakage power detecting means for detecting an adjacent channel leakage power under the transmission; and leakage power ratio calculating means for calculating an adjacent-channel leakage power ratio on the basis of the transmission power of the present channel detected by the transmission power detecting means and the adjacent-channel leakage power detected by the leakage power detecting means, wherein:

the transmitter has a transmission RF switch that is arranged at an antenna-side output terminal of the directional coupler and is able to switch over a path between a first output terminal to the antenna and a second output terminal other than the first output terminal, a dummy load connected to the second output terminal of the transmission RF switch, and a generator generating an RF dummy signal, and the radio system further comprising switch-over means for switching over the transmission RF switch so that the RF dummy signal is sent to the dummy load in pre-check transmission carried out before communication is started, the pre-check transmission being treated as the transmission, determination means for determining if the adjacent-channel leakage power ratio obtained by the leakage power ratio calculating means satisfies a specified condition or not in a state switched over to the dummy load by the switch-over means; and transmission start means for starting to transmit data to be transmitted by switching over the transmission RF switch to an antenna side thereof in cases determined that the specified condition is met.

6. The time-division multiplexing radio system according to claim 5, further comprising control means for controlling at least one of a gain of the transmitter and a bias of the amplifier of the transmitter so that the transmission power is controlled to make the adjacent-channel leakage power ratio satisfy the specified condition, in cases the determination means determines that the adjacent-channel leakage power ratio is not within the specified condition.

\* \* \* \* \*